(12) United States Patent
Song (10) Patent No.: US 8,441,876 B2
(45) Date of Patent: May 14, 2013

(54) MEMORY MODULE INCLUDING PARALLEL TEST APPARATUS

(75) Inventor: Won-hyung Song, Osan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 148 days.

(21) Appl. No.: 13/165,166

(22) Filed: Jun. 21, 2011

(65) Prior Publication Data

US 2011/0310685 A1  Dec. 22, 2011

(30) Foreign Application Priority Data

Jun. 21, 2010  (KR) .......................... 10-2010-0058626

(51) Int. Cl.
*G11C 29/00* (2006.01)

(52) U.S. Cl.
USPC .................. 365/201; 365/189.04; 365/230.06

(58) Field of Classification Search .................. 365/200, 365/201, 189.04, 189.05, 189.14, 189.17, 365/230.06
See application file for complete search history.

(56) References Cited

U.S. PATENT DOCUMENTS

| | | | | |
|---|---|---|---|---|
| 3,302,182 A | * | 1/1967 | Lynch et al. | 709/206 |
| 3,737,870 A | * | 6/1973 | Carter et al. | 714/6.32 |
| 6,515,922 B1 | | 2/2003 | Yamagata | |
| 6,536,005 B1 | * | 3/2003 | Augarten | 714/723 |
| 7,555,677 B1 | * | 6/2009 | Wiley et al. | 714/36 |
| 7,668,028 B2 | * | 2/2010 | Kim et al. | 365/201 |

FOREIGN PATENT DOCUMENTS

| | | |
|---|---|---|
| JP | 2003-007087 | 1/2003 |
| KR | 10-2000-0039772 A | 7/2000 |
| KR | 10-2001-0065333 A | 7/2001 |

* cited by examiner

*Primary Examiner* — Gene Auduong
(74) *Attorney, Agent, or Firm* — Lee & Morse, P.C.

(57) ABSTRACT

A memory module including a plurality of ranks. Each of the ranks includes a parallel test apparatus for simultaneous testing and a parallel test control unit. In response to a parallel test mode control signal, the parallel test apparatus generates first parity data for write data including a plurality of bits and generating first data obtained by replacing a bit value of at least one bit of the plurality of bits of the write data with the first parity data during a write operation, and generates second parity data for the first data and transmitting the second parity data as read data during a read operation. The parallel test control unit controls the write operation and the read operation in a parallel test mode by generating the parallel test mode control signal. Combinations of read data from the plurality of ranks correspond to different bits of the write data.

16 Claims, 11 Drawing Sheets

| MODULE INPUT | M_DQ0 | M_DQ1 |
| --- | --- | --- |
| PACKAGE INPUT | P_DQ0 | P_DQ1 |
| RANK A | RA_DQ0 | RA_DQ1 |
| RANK B | RB_DQ1 | RB_DQ0 |

MEMORY MODULE INCLUDING PARALLEL TEST APPARATUS

CROSS-REFERENCE TO RELATED APPLICATIONS

This application claims priority under 35 U.S.C. §119 to Korean Patent Application No. 10-2010-0058626, filed on Jun. 21, 2010, in the Korean Intellectual Property Office, and entitled: "Memory Module Including Parallel Test Apparatus," which is incorporated by reference herein in its entirety.

BACKGROUND

1. Field

Embodiments relate to a memory module, and more particularly, to a memory module including a parallel test apparatus for simultaneously testing a plurality of ranks.

2. Description of the Related Art

Semiconductor memory devices, such as dynamic random access memories (DRAMs), are produced after going through a circuit design and process step, a chip test step, a package test step, etc. During the chip test step or the package test step, the semiconductor memory devices are tested in various methods. Meanwhile, as the storage capacities of DRAMs have increased due to finer processing and the number of stacked DRAM chips has increased due to the advancement of semiconductor packaging technology and printed circuit board (PCB) technology, the capacities of dual in-line memory modules (DIMMs) have increased, thereby increasing a test time and a test cost. Accordingly, although various conventional test methods with a reduced test time are used, it is more difficult for various conventional test methods to accurately detect a defective part and a location of the defective part.

SUMMARY

One or more embodiments provide a memory module including a parallel test apparatus that may reduce a test time by simultaneously testing a plurality of ranks.

One or more embodiments provide a memory module including a plurality of ranks, each of the plurality of ranks including a parallel test apparatus configured to generate, in response to a parallel test mode control signal, first parity data for write data including a plurality of bits and first data that is obtained by replacing a bit value of at least one bit of the plurality of bits of the write data with the first parity data during a write operation, and generate second parity data for the first data and transmit the second parity data as read data during a read operation, and a parallel test control unit configured to control the write operation and the read operation in a parallel test mode by generating the parallel test mode control signal, wherein combinations of read data from the plurality of ranks correspond to different bits of the write data.

If the read data and the bit value of at least one bit of the write data replaced with the first parity data are the same, the rank through which the read data is transmitted is passed.

If the read data and the bit value of at least one bit of the write data replaced with the first parity data are inverted relative to each other, the rank through which the read data is transmitted is failed.

The parallel test apparatus may include at least one XOR gate configured to generate the first parity data for the write data during the write operation and generate the second parity data for the first data during the read operation, and at least one multiplexer configured to replace the bit value of at least one bit of the plurality of bits of the write data with the first parity data.

Each of the plurality of ranks may include an interface unit connected to the parallel test apparatus to communicate with the parallel test apparatus, and configured to receive the write data during the write operation and transmit the read data during the read operation, and a storage unit connected to the parallel test apparatus to communicate with the parallel test apparatus and configured store the first data.

The interface unit may include input/output lines respectively corresponding to the plurality of bits of the write data and shared by the plurality of ranks.

During the write operation, a receiver of all of the input/output lines may be driven during the write operation, and, during the read operation, a driver of remaining input/output lines other than an input/output line through which the read data is transmitted may not be driven.

During the write operation and the read operation in the parallel test mode, a data width of read data of each rank may be less than a data width of write data of each rank.

When a total number of the plurality of bits of the write data is n times a number of the plurality of ranks, a number of at least one bit of the write data replaced with the first parity data and a number of at least one bit of the read data are each n.

The module may include a memory controller for generating a parallel test mode start signal, wherein the parallel test control unit of each of the plurality of ranks generates the parallel test control signal in response to the parallel test mode start signal.

One or more embodiments provide a memory module including a plurality of ranks, each of the plurality of ranks including a parallel test apparatus configured to generate, in response to a parallel test mode control signal, a first parity bit for n write data bits and replace a bit value of at least one bit of the n write data bits with the first parity bit during a write operation, and generate a second parity bit for n first data bits including the first parity bit and n−1 remaining write data bits and transmit the second parity bit as one read data bit during a read operation, and a parallel test control unit configured to control the write operation and the read operation in a parallel test mode by generating the parallel test mode control signal, wherein n is a natural number equal to or greater than 2, and combinations of bits from the plurality of ranks correspond to the write data bits.

A number of write data bits and a number of ranks to be tested in the parallel test mode are each n.

If and the read data bit and the bit value of at least one bit of the write data bits replaced with the first parity bit are the same, the rank through which the read data is transmitted is passed.

If the read data bit and the bit value of at least one bit of the write data bits replaced with the first parity bit are inverted relative to each other, the rank through which the read data is transmitted is failed.

Each of the plurality of ranks may include an interface unit connected to the parallel test apparatus to communicate with the parallel test apparatus, the interface unit configured to receive the n write data bits during the write operation and transmitting the read data bit during the read operation, and a storage unit connected to the parallel test apparatus to communicate with the parallel test apparatus, the storage unit configured to store the n first data bits including the first parity bit and the n−1 remaining write data bits.

The interface unit may include input/output lines respectively corresponding to the write data bits and shared by the plurality of ranks.

In response to the parallel test mode control signal, a receiver of all of the input/output lines is driven during the write operation, and a driver of remaining input/output lines other than an input/output line corresponding to the read data bit may not be driven during the read operation.

The parallel test apparatus may include at least one XOR gate for generating the first parity bit for the n write data bits during the write operation, and generating the second parity bit for the n first data bits including the first parity bit and the n−1 remaining write data bits, and at least one multiplexer for replacing the bit value of one bit of the n write data bits with the first parity bit.

One or more embodiments provide a memory module, including a plurality of ranks each including a group of rank input/output terminals including a representative rank input/output terminal for transmitting read data, and a package including a group of package input/output terminals electrically connected to the group of rank input/output terminals of each of the plurality of ranks, wherein in a parallel test mode, each of the plurality of ranks receives write data of a full data width through the group of rank input/output terminals from the group of package input/output terminals, and transmits read data of a reduced data width through a corresponding package input/output terminal from the representative rank input/output terminal of each of the plurality of ranks, and package input/output terminals corresponding to representative rank input/output terminals of the plurality of ranks are different from one another in units of the ranks, and read data from the plurality of ranks corresponds to different bits of the write data.

Each of the plurality of ranks may include a parallel test apparatus configured to generate first parity data for write data including a plurality of bits and generate first data that is obtained by replacing a bit value of at least one bit of the plurality of bits of the write data with the first parity data during a write operation, and generate second parity data for the first data and transmitting the second parity data to the representative rank input/output terminal as the read data during a read operation, wherein combinations of read data from the plurality of ranks correspond to different bits of the write data.

One or more embodiments may provide a parallel test method for a memory module including a plurality of ranks, each of the ranks including a parallel test apparatus and configured to perform the parallel test method, the parallel test method, including receiving write data including a plurality of bits, generating first parity data corresponding to the write data, generating, during a write operation, first data that is obtained by replacing a bit value of at least one bit of the plurality of bits of the write data with the first parity data, generating, during a read operation, second parity data for the first data, and transmitting the second parity data as read data.

BRIEF DESCRIPTION OF THE DRAWINGS

Features and advantages will become more apparent to those of ordinary skill in the art by describing in detail exemplary embodiments with reference to the attached drawings, in which.

DETAILED DESCRIPTION

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, it will also be understood that when an element is referred to as being "between" two elements, it can be the only element between the two elements, or one or more intervening elements may also be present. Like reference numerals refer to like elements throughout the specification.

Figure 1:
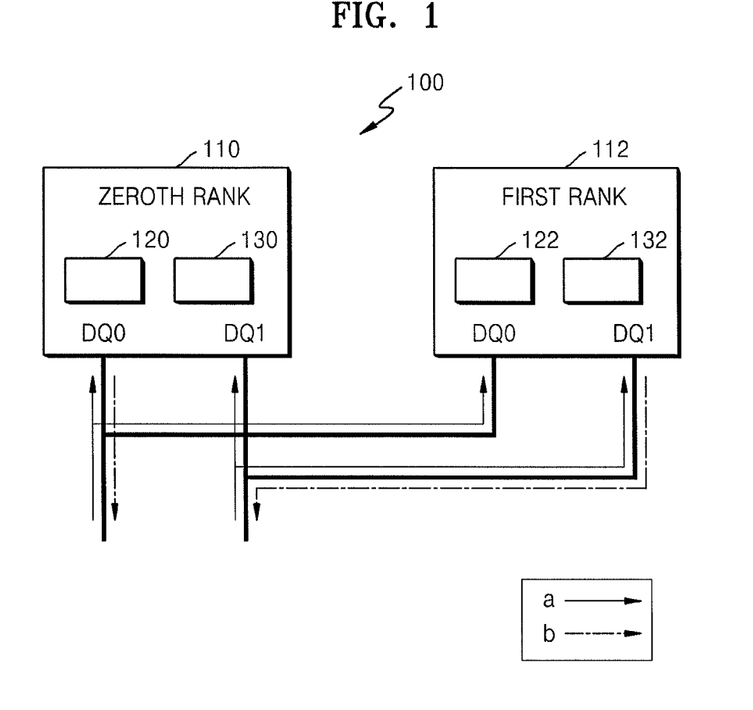
FIG. 1 illustrates a block diagram of an exemplary embodiment of a memory module.

FIG. 1 illustrates a block diagram of an exemplary embodiment of a memory module 100.

Referring to FIG. 1, the memory module 100 may include a zeroth rank 110 and a first rank 112. The memory module 100 may be a dual in-line memory module (DIMM). Herein, a rank may refer to a unit for distinguishing different dynamic random access memory (DRAM) chips sharing an input/output line. Although two ranks are shown in FIG. 1 for convenience of explanation, the memory module 100 may include more than two ranks. Likewise, although two input/output terminals DQ0 and DQ1 for inputting/outputting bits are shown, embodiments are not limited thereto. Furthermore, the zeroth and first ranks 110 and 112 may include parallel test apparatuses 130 and 132 and parallel test control units 120 and 122, respectively.

A memory controller (not shown) performs read, write, and other operations in accordance with a protocol in each of the zeroth and first ranks 110 and 112 according to a program set by a user. Herein, the memory controller sends a signal indicating whether each rank is to operate in a test mode or a normal mode. The zeroth and first ranks 110 and 112 respectively include the parallel test control units 120 and 122 for processing commands, e.g., read, write, and mode setting commands, input from the memory controller. When a specific command is input, the parallel test control units 120 and 122 change a general read/write operation to a read/write operation in a parallel test mode. The parallel test control units 120 and 122 in the zeroth and first ranks 110 and 112 control the flow of data in the zeroth and first ranks 110 and 112 in response to a parallel test mode start command input from the memory controller. As a result, during a write operation, bitstreams input through all data channels are processed (e.g., some bits are replaced with bit parities) and are separately stored in a storage unit, e.g., a memory cell array, in each of the zeroth and first ranks 110 and 112. During a read operation, a parity is generated from the bitstreams read from the storage unit and only the parity is sent through a reduced data channel. That is, in the parallel test mode, the write operation is performed with a full data width (channel) and the read operation is performed with a reduced data width. Accordingly, a smaller data channel is used, thereby maximizing the number of DRAMs to be simultaneously tested and reducing a test time and a test cost.

In detail, a solid line "a" shows the flow of data during a write operation, and a long-short dashed line "b" shows the flow of data during a read operation. The zeroth and first ranks 110 and 112 mounted on the memory module 100 share an input/output (I/O) line. In general, a line is shared by ranks due to wiring in a module, e.g., a printed circuit board (PCB), or a package. Accordingly, the parallel test control units 120 and 122 in the zeroth and first ranks 110 and 112 commonly receive write data in parallel test modes that are set for the respective zeroth and first ranks 110 and 112, and transmit read data through I/O lines that are independently assigned to the zeroth and first ranks 110 and 112. The I/O lines through which the read data is transmitted may be individually programmed by the parallel test control units 120 and 122 or may be designated through physical wiring.

Each of the zeroth and first ranks 110 and 112 will now be explained in detail with reference to FIG. 2.

Figure 2:
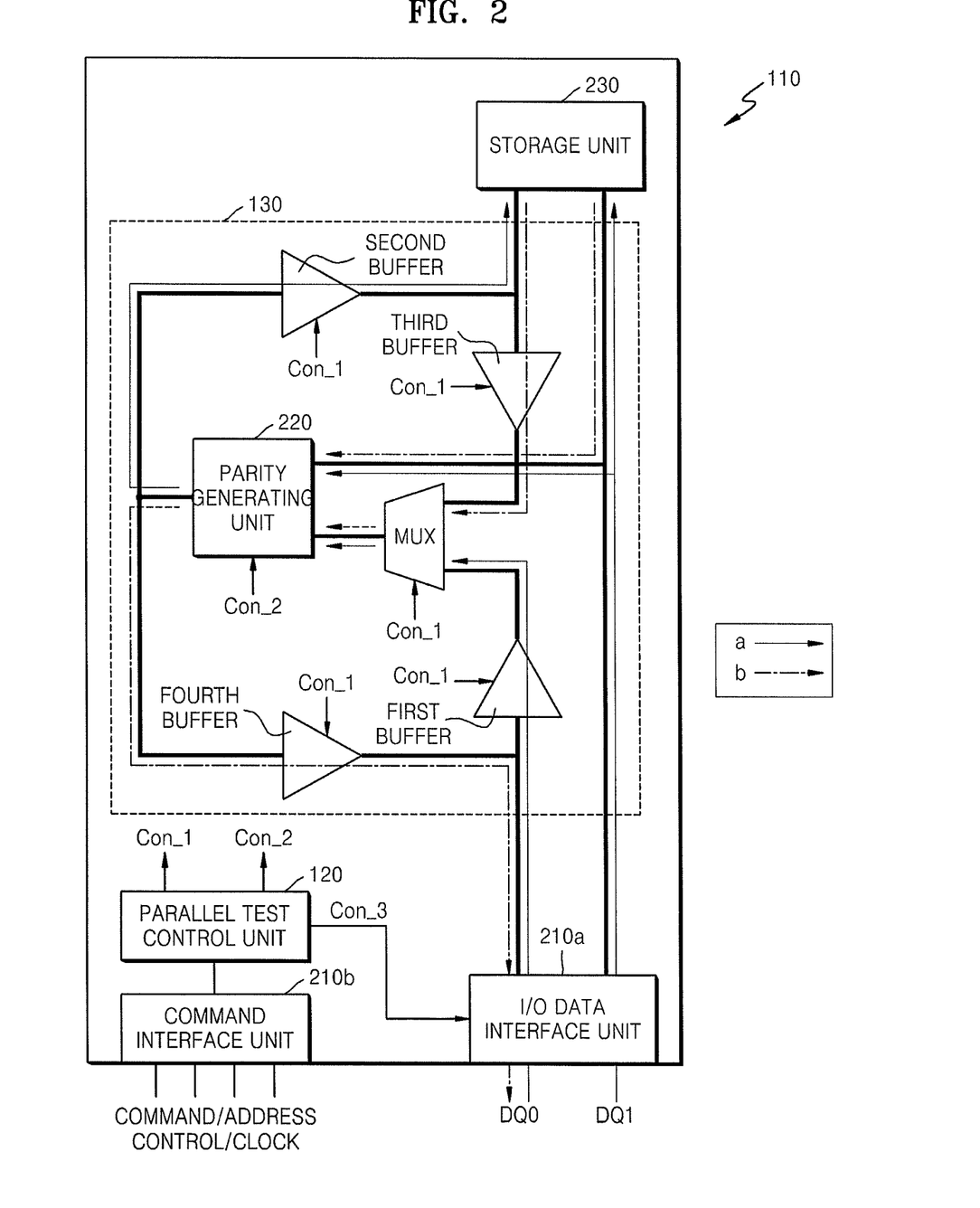
FIG. 2 illustrates a block diagram of an exemplary embodiment of a rank of the memory module of FIG. 1.

FIG. 2 illustrates a block diagram of an exemplary embodiment of the zeroth rank 110 of the memory module 100 of FIG. 1. Although the zeroth rank 110 is shown in FIG. 2, the operational principle of the zeroth rank 110 of the memory module 100 and the parallel test apparatus 130 included in the zeroth rank 110 may apply and/or be included to the other ranks.

Referring to FIGS. 1 and 2, the zeroth rank 110 may include an I/O data interface unit 210a, a command interface unit 210b, the parallel test apparatus 130, and a storage unit 230. Also, the parallel test apparatus 130 may include a parity generating unit 220, a multiplexer MUX, and first through fourth buffers.

The I/O data interface unit 210a and the command interface unit 210b transmit commands, e.g., commands, addresses, controls, and clocks, and I/O data input from the memory controller to the parallel test control unit 120. The commands include a parallel test start signal for starting a parallel test mode. The I/O data interface unit 210a may include the input/output terminals DQ0 and DQ1 corresponding to bits of write data, and input/output lines electrically connected to the input/output terminals DQ0 and DQ1. From among the input/output terminals DQ0 and DQ1, the input/output terminal DQ0 may be arbitrarily designated as a representative input/output terminal for reading a read data bit.

The I/O data interface unit 210a may be an interface unit used in a conventional DRAM, and may not be additionally provided for a test.

Each of the parallel test control units 120 and 122 generates parallel test mode control signals, e.g., first through third control signals Con_1, Con_2, and Con_3, for changing from a general write/read operation to a write/read operation in a parallel test mode when a parallel test mode start signal is input. In detail, although the parallel test mode control signals may include the first control signal Con_1, the second control signal Con_2, and the third control signal Con_3, embodiments are not limited thereto.

The first control signal Con_1 is used to control the multiplexer MUX and the first through fourth buffers, so that a read/write operation is performed in the zeroth rank 110 during a time interval.

During a write operation, the first control signal Con_1 may have a first logic value to turn on the first and second buffers and to cause write data from the first buffer to be selected by the multiplexer MUX. A solid line "a" shows the flow of data during the write operation.

During a read operation, the first control signal Con_1 may have a second logic value, opposite to the first logic value, to turn on the third and fourth buffers and to cause read data from the third buffer to be selected by the multiplexer MUX. A long-sort dashed line "b" shows the flow of data during the read operation.

The parity generating unit 220 may generate first parity data for write data and generate second parity data for first data, based on the second control signal Con_2. The first data is data obtained by replacing a bit value of at least one bit of bits of the write data with the first parity data.

The storage unit 230 may store the first data. The storage unit 230 may be separately provided, or may be an existing cell array of each rank.

The I/O data interface unit 210a may transmit second parity data as read data through the representative input/output terminal DQ0 in response to the third control signal Con_3, and may not drive a driver of the input/output line through which the read data is not transmitted.

If the bit value of at least one bit of the write data replaced with the first parity data is the same as the read data, the zeroth rank 110 may be determined to be passed.

If the bit value of at least one bit of the write data replaced with the first parity data and the read data are inverted relative to each other, the zeroth rank 110 may be determined to be failed.

As described above, in one or more embodiments, it may be determined whether a target rank is passed or failed, and thus, the target rank may be finally replaced.

An operation of each rank of the memory module 100 of FIG. 2 during a read/write operation will now be explained with reference to FIGS. 3A and 3B.

Figure 3A:
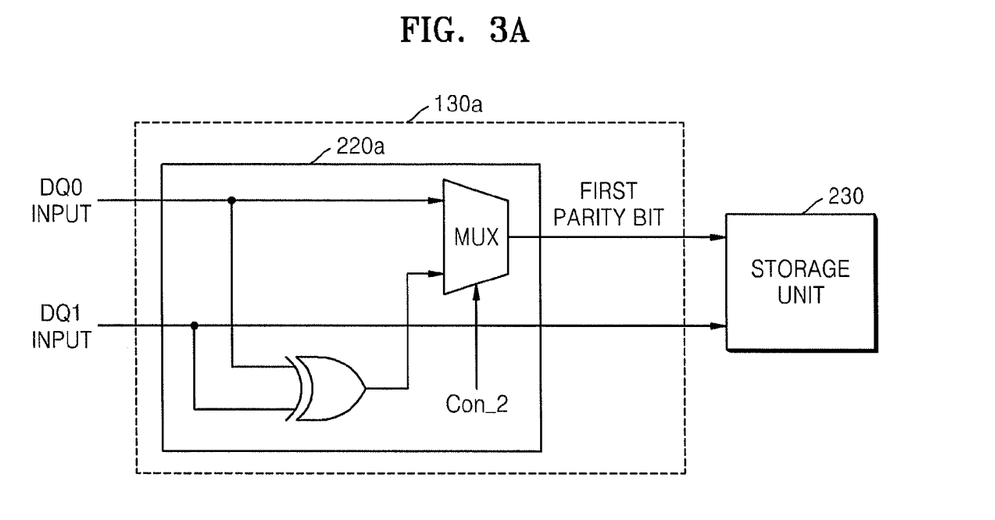
FIG. 3A illustrates a schematic diagram of the rank of FIG. 2 during a write operation.

FIG. 3A illustrates a schematic diagram of an exemplary embodiment of the parity generating unit 220a of the zeroth rank 110 during a write operation. FIG. 3B illustrates a schematic diagram of an exemplary embodiment of the parity generating unit 220b of the zeroth rank 110 during a read operation. The first through fourth buffers and the multiplexer MUX of the zeroth rank 110 are not shown for convenience of explanation, and only a line showing the flow of data is shown. Accordingly, the function of the parity generating unit 220a of the zeroth rank 110 of FIG. 2 during a write operation is the same as that of a parallel test apparatus 130a during a write operation, and the function of the parity generating unit 220b of the zeroth rank 110 of FIG. 2 during a read operation is the same as that of a parallel test apparatus 130b during a read operation. Accordingly, the parity generating unit 220a and the parallel test apparatus 130a (or the parity generating unit 220b and the parallel test apparatus 130b) are interchangeably used below.

Each of the parity generating units 220a and 220b may further include at least one XOR gate for generating parity data and a multiplexer MUX for replacing data with the parity data. A write operation will be first explained.

Referring to FIGS. 1, 2, and 3A, the parallel test apparatus 130a of the zeroth rank 110 receives a first bit and a second bit as write data through the representative input/output terminal DQ0 and the second input/output terminal DQ1, respectively. The XOR gate performs an XOR operation on the first bit and the second bit to generate a first parity bit as first parity data. The multiplexer MUX discards the first bit and selects the first parity bit. The storage unit 230 stores the first parity bit and the second bit as first data.

An exemplary read operation will now be explained.

Figure 3B:
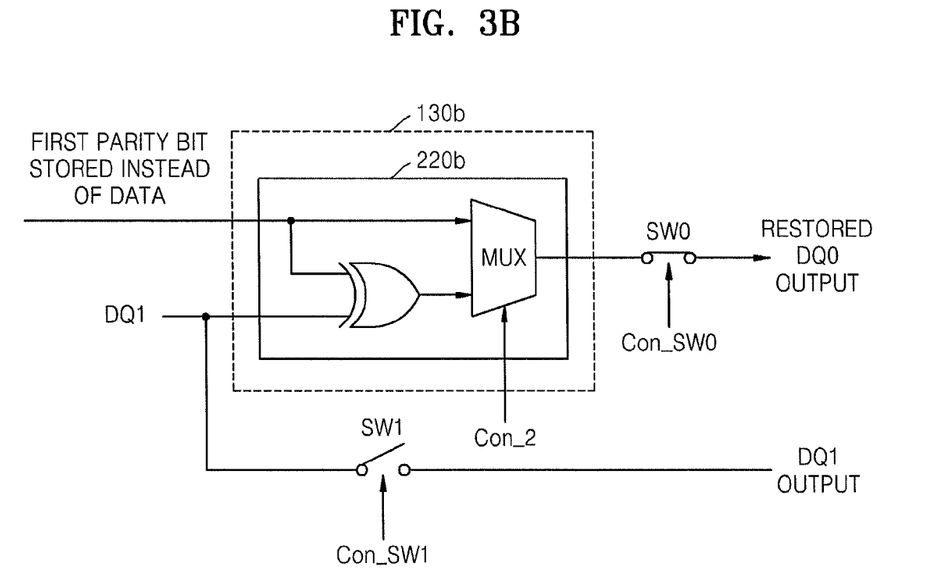
FIG. 3B illustrates a schematic diagram of the rank of FIG. 2 during a read operation.

Referring to FIGS. 1, 2, and 3B, the parallel test apparatus 130b of the zeroth rank 110 performs an XOR operation on the second bit and the first parity bit of the first data to generate a second parity bit. The multiplexer MUX selects the second parity bit. The representative input/output terminal DQ0 may transmit the second parity bit as read data in response to a switch control signal Con_SW0, and at the same time block the flow of data by opening a first switch SW1 of an input/output line of the second bit in response to a first switch control signal Con_SW1. The switch control signal Con_SW0 and the first switch control signal Con_SW1 may be sub-control signals of the third control signal Con_3.

If the second parity bit and the first bit of the write data are the same, the zeroth rank 110 is determined to be passed. If the second parity bit and the first bit of the write data are inverts of each other, the zeroth rank 110 is determined to be failed. As a result, in one or more embodiments, the memory module 100 may not express whether a specific chip is passed or failed with respect to all I/O lines as 0/1 or a predetermined value, and may express whether a specific chip is passed or failed with respect to all I/O lines as a data bit written to a system. Embodiments of a memory module employing one or more features described herein, e.g., the memory module 100, may detect a defective rank and an address of the defective rank by using a location and an address of a failed representative input/output terminal in the same manner as used during a single rank (1R) DIMM test.

The multiplexer MUX and the XOR gate illustrated in each of FIGS. 3A and 3B may be the same and/or may be separately provided.

A more detailed example will be explained with reference to FIGS. 1 through 3B. Embodiments are not, however, limited thereto. It is assumed that bit values of a first bit and a second bit of write data (0, 1) are 0 and 1, respectively. In response to a parallel test control signal input from the parallel test control unit 120, the zeroth rank 110 may set the input/output terminal DQ0 of the zeroth rank 110 as a representative input/output terminal for transmitting read data, and the first rank 112 may arbitrarily set the input/output terminal DQ1 of the first rank 112 as a representative input/output terminal for transmitting read data. In the zeroth rank 110, the XOR gate performs an XOR operation on the write data (0, 1) to generate a bit value 1 of a first parity bit, and the multiplexer MUX selects the bit value 1 of the first parity bit instead of the bit value 0 of the first bit. The storage unit 230 stores first data (1, 1) including the bit value 1 of the first parity bit and the bit value 1 of the second bit of the write data. The XOR gate performs an XOR operation on the first data (1, 1) to generate a bit value 0 of a second parity bit. The zeroth rank 110 transmits the bit value 0 of the second parity bit to the parallel test control unit 120 through the representative input/output terminal DQ0 of the zeroth rank 110. Likewise, the first rank 112 generates a bit value 1. Next, the first rank 112 transmits the bit value 1 to the parallel test control unit 120 through the representative input/output terminal DQ1. In this case, both the zeroth rank 110 and the first rank 112 are determined to be passed. The zeroth rank 110 and the first rank 112 are determined to be failed if logic values of read data and the write data are inverted to each other.

In most conventional methods for reducing a test cost, whether a product is good or defective is previously determined, a signal indicating that the product is good or defective in units is output, and a tester, e.g., an automated test equipment (ATE), or a system, checks the signal indicating that the product is good or defective. Since whether a product is good or defective may be determined only when both a target product and a reference product exist, and the tester should check a signal indicating that the target product is good or defective, not a written signal, most of the conventional methods are at least problematic, e.g., in that a signal other than a signal written to check a failure should be checked, a plurality of blocks should always be simultaneously driven, and the configuration of a product in a mount system may not be supported by a memory controller in the simultaneously driven blocks.

Embodiments of a memory module including one or more features described herein, e.g., the memory module 100, may discard data and store a parity of written data, and during a read operation, if there is no data failure, the same data as the data discarded when the parity is stored is restored and output, and if there is a data failure, an inverted type is output. This is because, in a bit set including n bits and a parity 1 bit of a corresponding bit column, no matter if any 1 bit is selected, the corresponding bit is a parity for remaining n bits.

Accordingly, embodiments of a memory module employing one or more features described herein, e.g., the memory module 100, may be used at low cost because parts to be changed in a product line or a test infrastructure are very small. More particularly, e.g., embodiments of a memory module employing one or more features described herein, e.g., the memory module 100, may employ a relatively low number of XOR gates. Also, while embodiments of a memory module employing one or more features described herein, e.g., the memory module 100, may employ a relatively small number of bits, may experience a same and/or improved level of reliability in determining whether a product is good or defective.

Figure 4A:
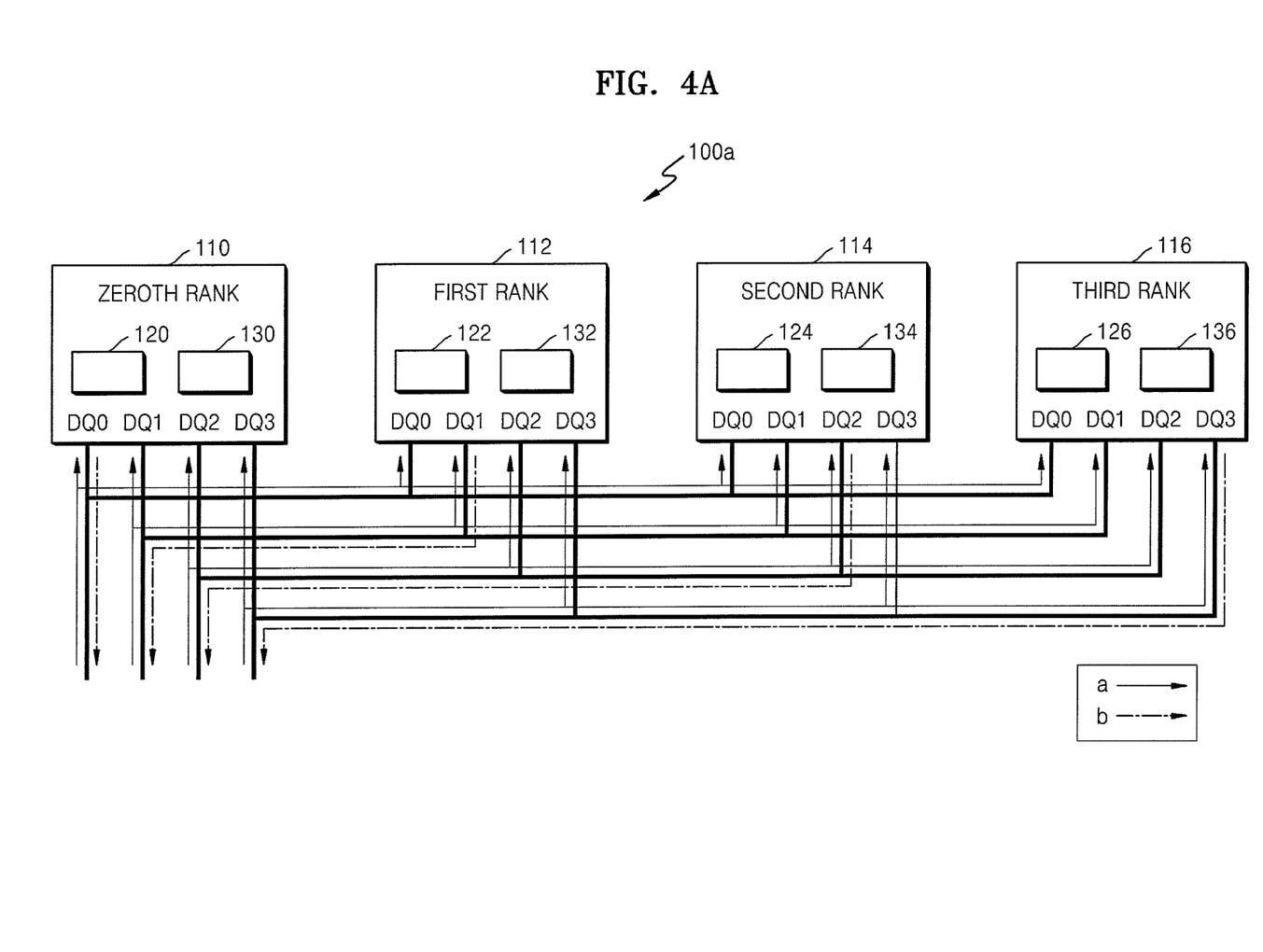
FIGS. 4A and 4B illustrate block diagrams of exemplary embodiments of a memory module.
Figure 4B:
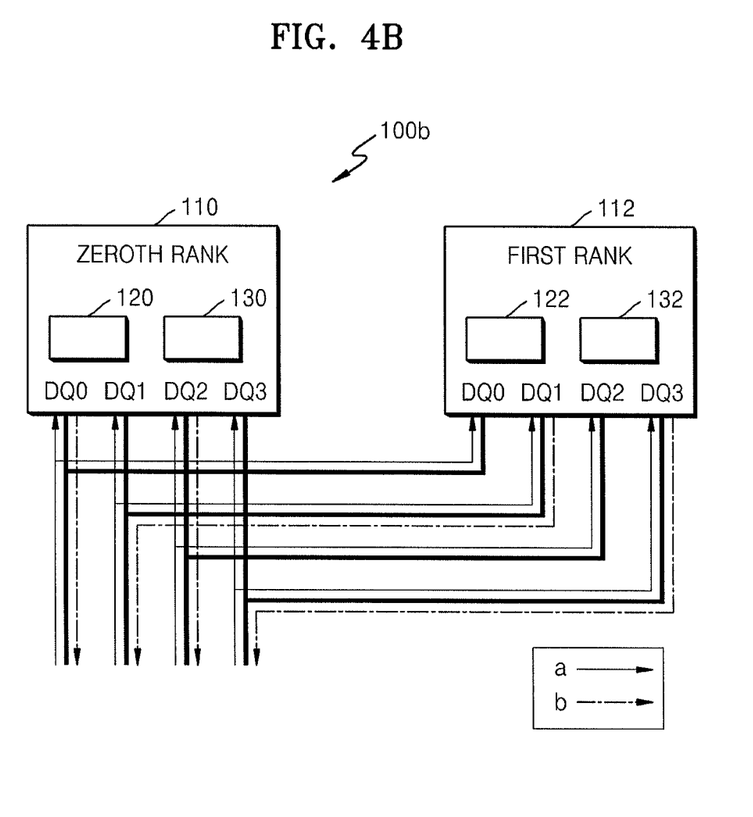

FIGS. 4A and 4B illustrate block diagrams of other exemplary embodiments of memory modules 100a and 100b. An operation of each of the ranks of the memory modules 100a and 100b of FIGS. 4A and 4B may be the same as that described with reference to FIG. 2.

Assuming that the memory module 100a is an x4 DRAM having zeroth through third ranks 110, 112, 114, and 116, FIG. 4A illustrates the memory module 100a in an x4 test mode in which all of the zeroth through third ranks 110, 112, 114, and 116 are tested. That is, four input/output lines are shared by the zeroth through third ranks 110, 112, 114, and 116. Also, FIG. 4B illustrates the memory module 100b in a x2 test mode in which only two ranks, that is, the zeroth and first ranks 110 and 112, are tested. That is, 4 input/output lines are shared by the zeroth and first ranks 110 and 112.

The x4 test mode or the x2 test mode may be based on the second control signal Con_2 input from the parallel test control unit 120 of FIG. 2.

An exemplary operation of each rank of FIGS. 4A and 4B during a read/write operation in the x4 test mode or the x2 test mode will be explained with reference to FIGS. 5A and 5B.

Figure 5A:
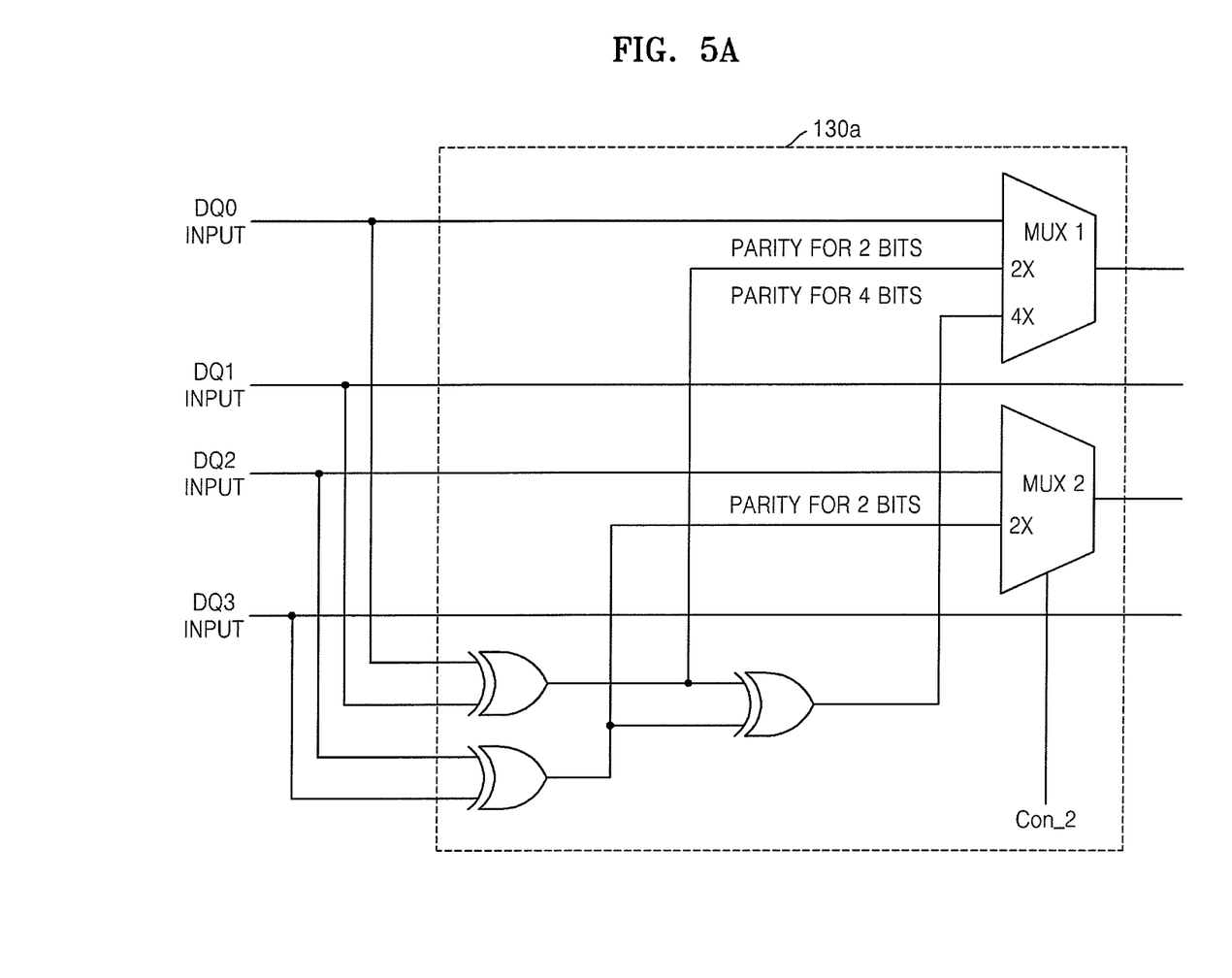
FIG. 5A illustrates a block diagram of an exemplary embodiment of a rank of the memory module of FIGS. 4A and 4B during a write operation.

FIG. 5A illustrates a block diagram of the parallel test apparatus 130a of FIGS. 4A and 4B during a write operation. FIG. 5B illustrates a block diagram of the parallel test apparatus 130b of FIGS. 4A and 4B during a read operation.

Referring to FIGS. 4A and 5A, in the x4 test mode, the zeroth rank 110 receives a first bit, a second bit, a third bit, and a fourth bit as write data respectively through the representative input/output terminal DQ0, the second input/output terminal DQ1, a third input/output terminal DQ2, and a fourth input/output terminal DQ3. A plurality of XOR gates performs XOR operations on the first bit, the second bit, the third bit, and the fourth bit to generate a first parity bit. A first multiplexer MUX 1 discards the first bit in response to the second control signal Con_2, and selects the first parity bit. A second multiplexer MUX 2 does not select anything in response to the second control signal Con_2, and transmits the second through fourth bits to the storage unit 230. The storage unit 230 stores the first parity bit, and the second, third, and fourth bits. Next, a read operation will be explained.

Figure 5B:
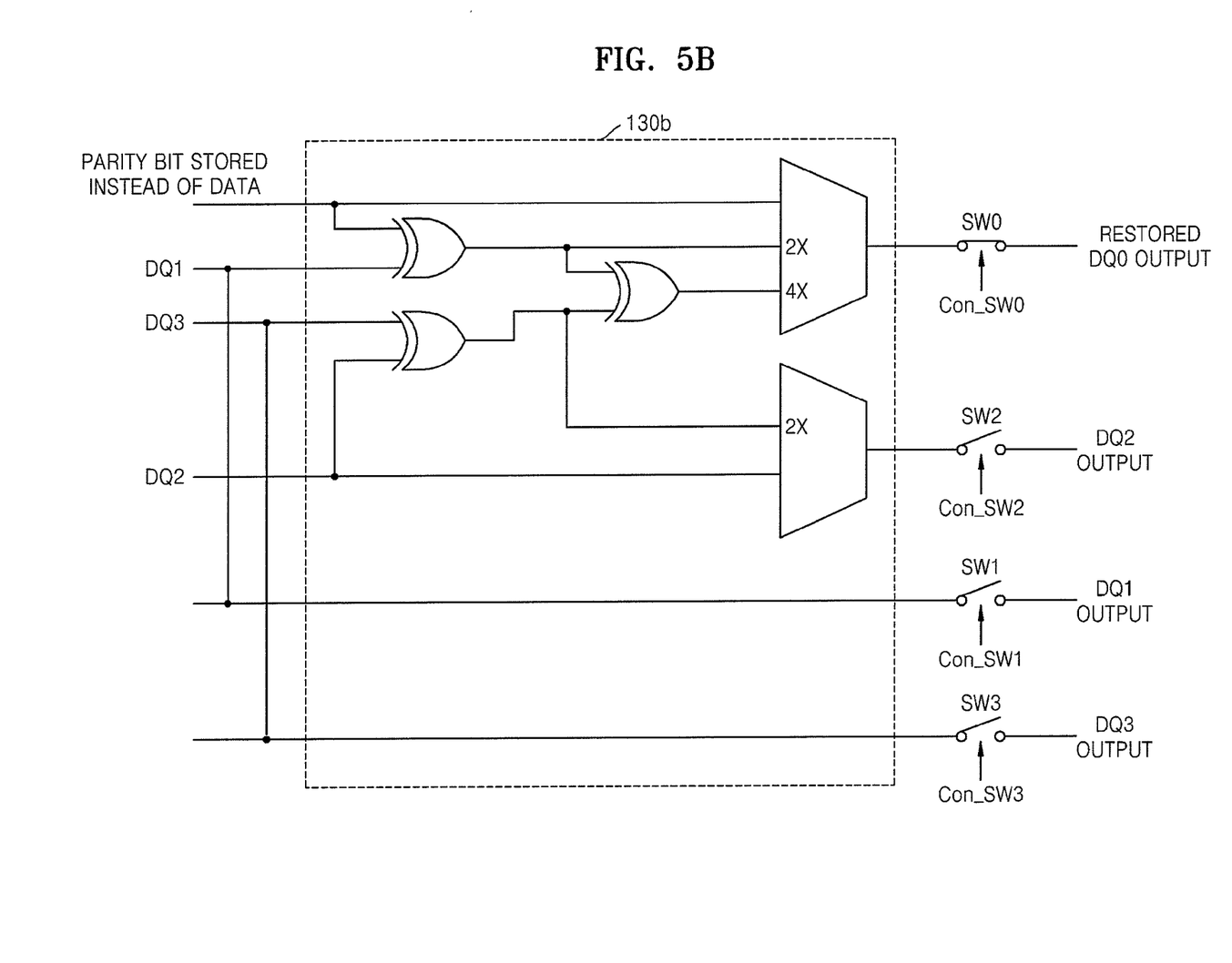
FIG. 5B illustrates a block diagram of the rank of FIG. 5A during a read operation.

Referring to FIGS. 4A and 5B, one or more XOR gates perform XOR operations on the first parity bit and the second, third, and fourth bits to generate a second parity bit. The first multiplexer MUX 1 selects the second parity bit. The second parity bit may be transmitted as a read data bit through the representative input/output terminal DQ0 in response to a switch control signal Con_SW0. At the same time, a driver of input/output lines of the remaining bits, that is, the second, third, and fourth bits, may not be driven in response to first through third switch control signals Con_SW1, Con_SW2, and Con_SW3. The first through fourth switch control signals Con_SW1, Con_SW2, Con_SW3, and Con_SW4 may be subcontrol signals of the third control signal Con_3.

If the read data bit and the first bit of the write data replaced with the first parity bit are the same, a test result may be determined to be passed.

If the read data bit and the first bit of the write data replaced with the first parity bit are inverted to each other, a test result may be determined to be failed.

Next, an exemplary embodiment of a read/write operation of a parallel test apparatus of each rank when the x4 test mode is changed to an x2 test mode in which only two of the four ranks 110, 112, 114, and 16 are tested in response to the second control signal Con_2 will be explained.

Referring back to FIGS. 4A and 5A, in the x2 test mode, the zeroth through fourth ranks 110, 112, 114, and 116 receive write data including first, second, third, and fourth bits through a full data channel.

The parallel test apparatus 130a of the zeroth rank 110 receives a first bit, a second bit, a third bit, and a fourth bit as write data respectively through the representative input/output terminal DQ0, the first input/output terminal DQ1, a second representative input/output DQ2, and a third input/output terminal DQ3. The plurality of XOR gates perform XOR operations on the first bit and the second bit to generate a third parity bit, and perform XOR operations on the third bit and the fourth bit to generate a fourth parity bit. The first multiplexer MUX 1 discards the first bit in response to the second control signal Con_2 input from the parallel test control unit 120, and selects the third parity bit. Also, the second multiplexer MUX 2 discards the third bit in response to the second control signal Con_2 INPUT from the parallel test control unit 120 and selects the fourth parity bit. The storage unit 230 stores the third parity bit, the second bit, the fourth parity bit, and the fourth bit. Next, a read operation will be explained.

Referring to FIGS. 4B and 5B, the plurality of XOR gates perform XOR operations on the third parity bit and the second bit to form a fifth parity bit, and perform XOR operations on the fourth parity bit and the fourth bit to generate a sixth parity bit. The first multiplexer MUX 1 selects the fifth parity bit and the second multiplexer MUX 2 selects the sixth parity bit. In response to the switch control signal Con_SW0, the fifth parity bit is transmitted through the representative input/output terminal DQ0. Also, in response to the second switch control signal Con_SW2, the sixth parity bit is transmitted through the second representative input/output terminal DQ2. At the same time, in response to the first and third switch control signals Con_SW1 and Con_SW3, first and third switches SW1 and SW3 are opened and the driver of the input/output lines of the second and fourth bits may not be driven.

If the fifth parity bit and the first bit of the write data replaced with the first parity bit are the same, a test result may be determined to be passed.

If the sixth parity bit and the third bit of the write data replaced with the first parity bit are inverted to each other, a test result may be determined to be failed.

Figure 6:
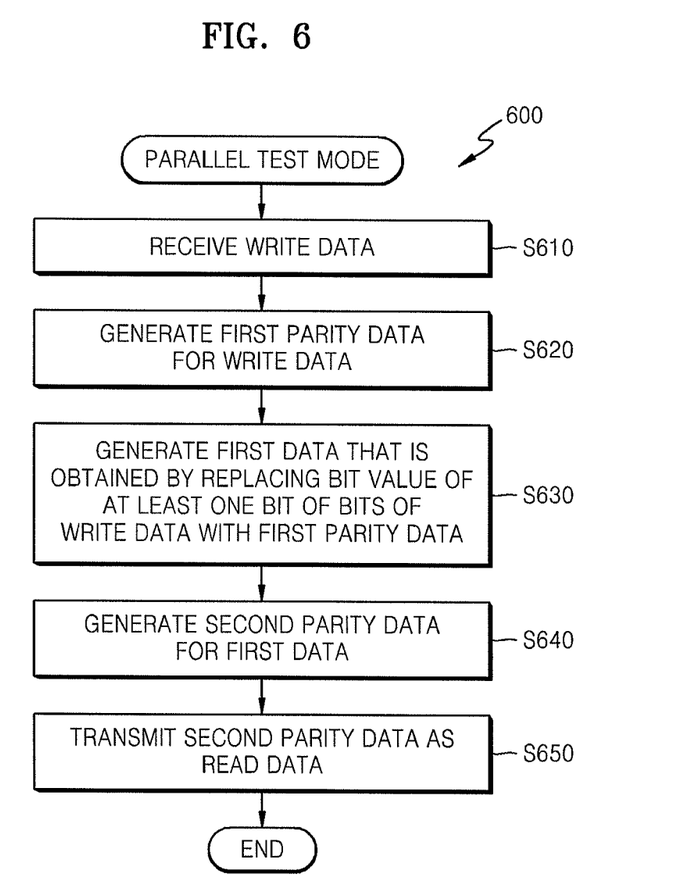
FIG. 6 illustrates a flowchart of an exemplary embodiment of a parallel test method employable by a memory module.

FIG. 6 illustrates a flowchart of an exemplary embodiment of a parallel test method employable by a memory module, e.g., the memory module 100. The parallel test method may be a parallel test method performed in each rank of the memory module 100 of FIG. 2. Referring to FIG. 6, a parallel test apparatus of each rank may perform operation S610 in which write data is received, operation S620 in which first parity data for the write data is generated, operation S630 in which first data obtained by replacing a bit value of at least one bit of bits of the write data with the first parity data is generated, operation S640 in which second parity data for the first data is generated, and operation S650 in which the second parity data is transmitted as read data. Combinations of read data input from ranks may correspond to different bits of the write data. That is, read bits do not collide.

Figure 7:
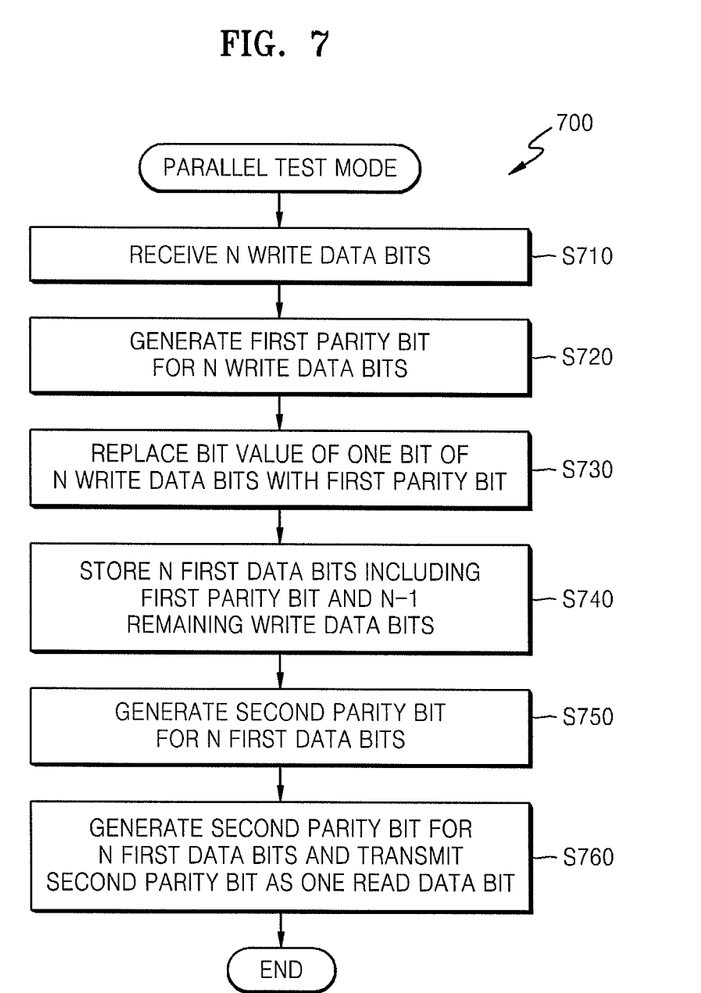
FIG. 7 illustrates a more detailed flowchart of an exemplary embodiment of a parallel test method employable by a memory module.

FIG. 7 illustrates a detailed flowchart of an exemplary embodiment of a parallel test method employable by a memory module, e.g., memory module 100. The parallel test method may be a parallel test method performed in each rank of the memory module 100 of FIG. 2. Referring to FIG. 7, a parallel test apparatus of each rank may perform operation S710 in which n write data bits are received, operation S720 in which a first parity bit for the n write data bits is generated, operation S730 in which a bit value of one bit of the n write data bits is replaced with the first parity bit, operation S740 in which n first data including the first parity bit and n−1 remaining write data bits are stored, operation S750 in which a second parity bit for the n first data bits is generated, and operation S760 in which the second parity bit is transmitted as one read data bit. In such embodiments, n may be a natural number equal to or greater than 2, and combinations of bits of ranks may correspond to the write data bits. That is, read bits do not collide.

The parallel test method illustrated in FIGS. 6 and 7 is similar to the parallel test method described in detail with reference to FIGS. 1 through 5B, and thus, a detailed explanation thereof will not be repeated.

Figure 8A:
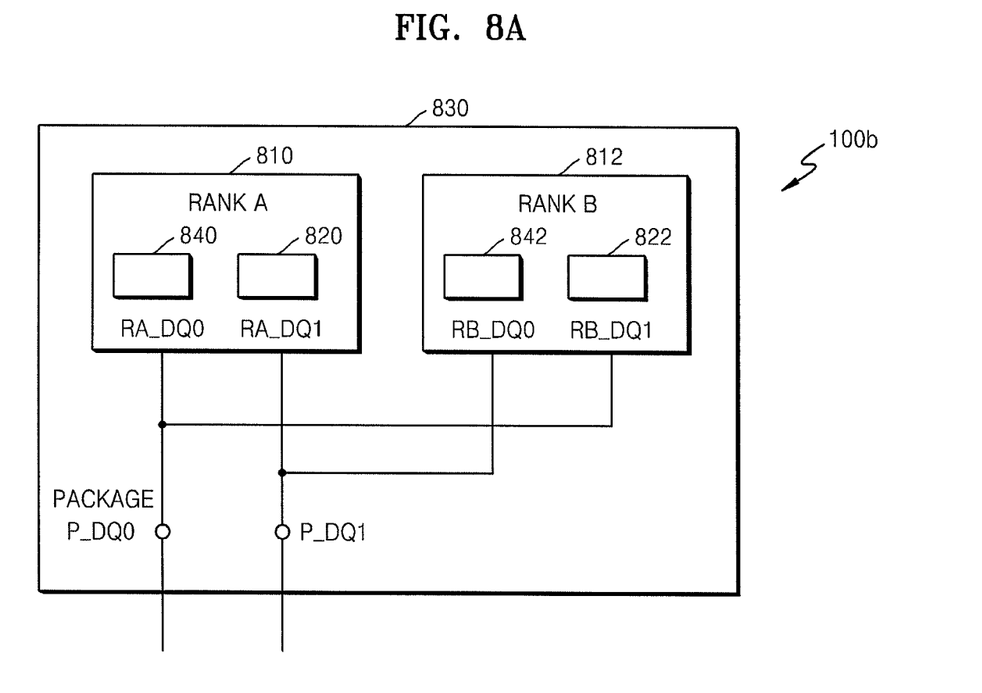
FIG. 8A illustrates a block diagram of an exemplary embodiment of an electrical connection configuration between a rank input/output terminal and a package input/output terminal or a module input/output terminal in a memory module.

FIG. 8A illustrates a block diagram of an exemplary embodiment of an electrical connection configuration between a rank input/output terminal and a package input/output terminal or a module input/output terminal in a memory module 100b. Embodiments are not limited thereto.

Referring to FIG. 8A, the memory module 100*b* may include a package 830 including a plurality of ranks, that is, a rank A 810 and a rank B 812.

The rank A 810 and the rank B 812 may respectively include parallel test apparatuses 820 and 822, each of which, during a write operation, generates first parity data for write data and generates first data obtained by replacing a bit value of at least one bit of bits of the write data with the first parity data, and during a read operation, generates second parity data for the first data and transmits the second parity data as read data. Also, the rank A 810 and the rank B 812 may respectively include parallel test control units 840 and 842 for controlling read and write operations of the parallel test apparatuses 820 and 822. Operations of the parallel test apparatuses 820 and 822 are the same as those of the parallel test apparatuses 130 and 132 of FIG. 2, and thus a detailed explanation thereof will not be repeated.

Further, the rank A 810 may include a group of rank A input/output terminals RA_DQ0 and RA_DQ1 wherein the rank A input/output terminal RA_DQ0 is a representative rank A input/output terminal for transmitting read data. Likewise, the rank B 812 may include a group of rank B input/output terminals RB_DQ0 and RB_DQ1 wherein the rank B input/output terminal RB_DQ0 is a representative rank B input/output terminal for transmitting read data. The package 830 may include a group of package input/output terminals P_DQ0 and P_DQ1 respectively electrically connected to the group of rank A input/output terminals RA_DQ0 and RA_DQ1 and the group of rank B input/output terminals RB_DQ0 and RB_DQ1. The representative rank A input/output terminal RA_DQ0 and the representative rank B input/output terminal RB_DQ0 are electrically connected to different package input/output terminals from among the group of package input/output terminals PA_DQ0 and PA_DQ1. Accordingly, read data from the representative rank A input/output terminal RA_DQ0 and the representative rank B input/output terminal RB_DQ0 may correspond to different bits of write data. That is, read data bits do not collide.

For reference, although a package including a plurality of ranks is shown in FIG. 8A, the same connection relationship may be applied to a memory module including a plurality of packages by electrically connecting representative package input/output terminals of each package for transmitting read data to different input/output terminals, as will be explained later with reference to FIG. 10.

Figure 8B:
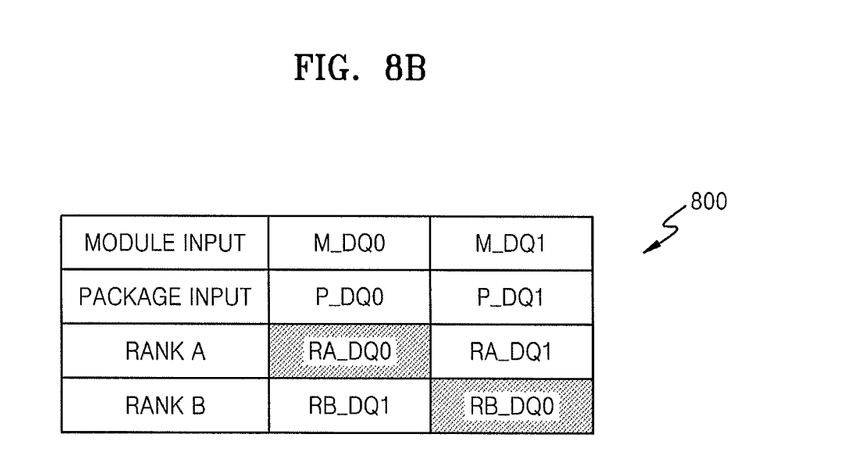
FIG. 8B illustrates a table showing the electrical relationship between the rank input/output terminal and the package input/output terminal or the module input/output terminal in the memory module of FIG. 8A.

FIG. 8B illustrates a table 800 showing electrical connection, that is, (physical) wiring, between the input/output terminals of FIG. 8A. Input/output terminals for transmitting read data are shown as gray fields.

For example, referring to FIGS. 8A and 8B, when bit values of a first bit and a second bit of write data are respectively 0 and 1, the bit value 0 of the first bit is transmitted to the representative rank A input/output terminal RA_DQ0 through the package input/output terminal P_DQ0, and the bit value 1 of the second bit is transmitted to the first rank A input/output terminal RA_DQ1 through the first package input/output terminal P_DQ1. At the same time, the bit value 1 of the second bit is transmitted to the representative rank B input/output terminal RB_DQ0 through the first package input/output terminal P_DQ1, and the bit value 0 of the first bit is transmitted to the first rank B input/output terminal RB_DQ1 through the package input/output terminal P_DQ0.

A process of outputting read data after the parallel test apparatuses 820 and 822 of the ranks 810 and 812 receive write data has been described in detail with reference to FIGS. 1 through 3B, and thus an explanation thereof will not be repeated.

If the rank A is determined to be passed, a read data bit received through the representative rank A input/output terminal RA_DQ0 and the package input/output terminal P_DQ0 is 0 and if the rank A is determined to be failed, the read data bit is 0. Likewise, if the rank B is determined to be passed, a read data bit received through the representative rank B input/output terminal RB_DQ0 and the first package input/output terminal P_DQ1 is 1, and if the rank B is determined to be failed, the read data bit is 0.

As a result, according to the inventive concept, physical wiring varies according to a rank so that bits transmitted through a shared input/output line do not collide, thereby reducing a test time.

Figure 9:
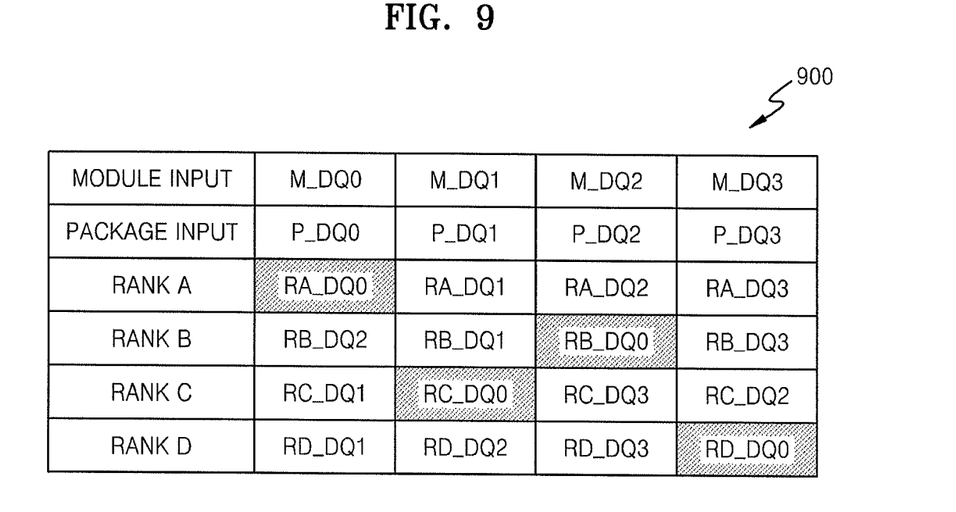
FIG. 9 illustrates a table showing an electrical coupling configuration between a rank input/output terminal and a package input/output terminal or a module input/output terminal in a memory module, according to another exemplary embodiment.

FIG. 9 illustrates a table 900 showing an electrical coupling configuration between a rank input/output terminal and a package input/output terminal or a module input/output terminal in a memory module, according to another exemplary embodiment. In particular, FIG. 9 illustrates an electrical coupling configuration between a rank input/output terminal and a package input/output terminal or a module input/output terminal in a quad-die package (QDP)-based quad-rank configuration. That is, in a memory module including one package including four ranks (i.e., a rank A, a rank B, a rank C, and a rank D) on one surface of a PCB, the table 900 shows an electrical coupling configuration between groups of rank A through rank D input/output terminals RA_DQ0 through RA_DQ3, RB_DQ0 through RB_DQ3, RC_DQ0 through RD_DQ3, and RD_DQ0 through RD_DQ3 and a group of package input/output terminals P_DQ0 through P_DQ3 or a group of module input/output terminals M_DQ0 through M_DQ3. The connection relationship is the same as that described with reference to FIGS. 8A and 8B, and thus will be briefly explained.

Referring to FIG. 9, the rank A through the rank D may designate representative rank input/output terminals RA_DQ0, RB_DQ0, RC_DQ3, and RD_DQ4 for transmitting read data (shown as gray fields in FIG. 9), respectively. The representative rank input/output terminals RA_DQ0, RB_DQ0, RC_DQ3, and RD_DQ4 are respectively electrically connected, that is, wired, to different package input/output terminals in the group of package input/output terminals P_DQ0 through P_DQ3. For example, referring to the table 900, the representative rank A input/output terminal RA_DQ0 is connected to the package input/output terminal P_DQ0, the representative rank B input/output terminal RB_DQ0 is connected to the second package input/output terminal P_DQ2, the representative rank C input/output terminal RC_DC0 is connected to the first package input/output terminal P_DQ1, and the representative rank D input/output terminal RD_DQ0 is connected to the third package input/output terminal P_DQ3. Electrical connections between the group of module input/output terminals M_DQ0 through M_DQ3 and the group of package input/output terminals P_DQ0 through P_DQ3 is the same as that of a conventional art, and thus an explanation thereof will not be repeated.

Figure 10:
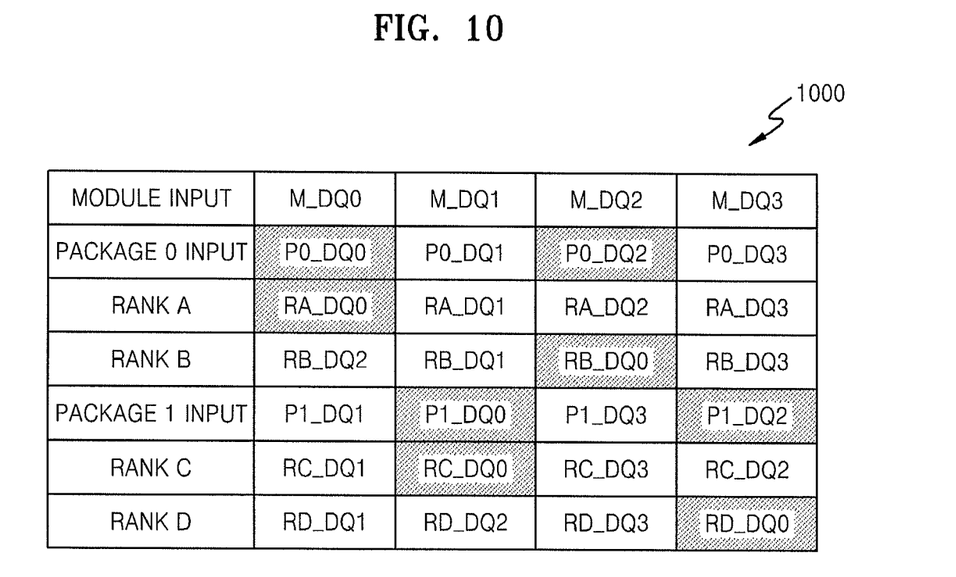
FIG. 10 illustrates a table the electrical coupling configuration between the rank input/output terminal and the package input/output terminal or the module input/output terminal in a memory module, according to another exemplary embodiment.

FIG. 10 illustrates a table 1000 showing an electrical coupling configuration between a rank input/output terminal and a package input/output terminal or a module input/output terminal in a memory module, according to another exemplary embodiment. In particular, FIG. 10 illustrates an electrical coupling configuration between a rank input/output terminal and a package input/output terminal or a module input/output terminal in a dual-die package (DDP)-based quad-rank configuration. That is, FIG. 10 illustrates a memory module including one package (i.e., a zeroth package) including two ranks (i.e., a rank A and a rank B) on one surface of a PCB and another package (i.e., a first package)

including two ranks (i.e., a rank C and a rank D) on the opposite surface of the PCB. In the case, the rank A and the rank B may designate representative rank input/output terminals RA_DQ0 and RB_DQ0 for transmitting read data. Also, the rank C and the rank D may designate representative rank input/output terminals RC_DQ0 and RD_DQ0 for transmitting read data. The representative rank input/output terminals are electrically connected to different package input/output terminals in a group of package input/output terminals.

Further, referring to FIG. 10, the zeroth package and the first package may include representative package 0 input/output terminals P0_DQ0 and P0_DQ2 and representative package 1 input/output terminals P1_DQ0 and P1_DQ2 for transmitting read data (which are shown as gray fields in FIG. 10). The representative package 0 input/output terminals P0_DQ0 and P0_DQ2 and the representative package 1 input/output terminals P1_DQ0 and P1_DQ2 may be electrically connected to different module input/output terminals in a group of module input/output terminals. In general, since even-numbered package input/output terminals P1_DQ1 and P1_DQ3 on a front surface of a module are wired to odd-numbered package input/output terminals P0_DQ0 and P0_DQ2 on a rear surface of the module, if read data is transmitted through the even-numbered input/output terminals, the even-numbered input/output terminals may be wired to different module input/output terminals in a group of module input/output terminals. However, the present embodiment is not limited thereto.

For example, referring to FIG. 10, the representative rank A input/output terminal RA_DQ0 is connected to the package 0 input/output terminal P0_DQ0, and the representative rank B input/output terminal RB_DQ0 is connected to the second package 0 input/output terminal P0_DQ2. Furthermore, the representative rank C input/output terminal RC_DQ0 is connected to the first package 1 input/output terminal P1_DQ1, and the representative rank D input/output terminal RD_DQ0 is connected to the third package 1 input/output terminal P1_DQ3.

Next, the representative package 0 input/output terminals P0_DQ0 and P0_DQ2 are respectively electrically connected to the module input/output terminal M_DQ0 and the second module input/output terminal M_DQ2. Also, the representative package 1 input/output terminals P1_DQ0 and P1_DQ2 are respectively electrically connected to the first module input/output terminal M_DQ1 and the third module input/output terminal M_DQ3. Finally, even one bit does not collide.

As a result, different I/O lines do not need to be designated according to chips in a test mode by adjusting connection between packages and module input/output terminals.

As described above, embodiments of a memory module employing one or more features described herein may reduce a test time by allowing all ranks to share an input/output line during a write operation and allowing an output value to be sent through an input/output line designated for each rank during a read operation.

Each of the ranks may store 1 bit as a parity for all inputs/outputs, not as corresponding data. As a result, the rank does not indicate whether a chip is passed or failed as 0/1 or a determined value, but indicates where a chip is passed or failed as data written to the rank and inverted data. Accordingly, the memory module may detect a defective rank and an address of the defective rank by using a location and an address of a rank including an input/output line through which a bit indicating failure is output.

Exemplary embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A memory module having a plurality of ranks, each of the plurality of ranks comprising:
a parallel test apparatus configured to generate, in response to a parallel test mode control signal, first parity data for write data including a plurality of bits and first data that is obtained by replacing a bit value of at least one bit of the plurality of bits of the write data with the first parity data during a write operation, and generate second parity data for the first data and transmit the second parity data as read data during a read operation; and
a parallel test control unit configured to control the write operation and the read operation in a parallel test mode by generating the parallel test mode control signal,
wherein combinations of read data from the plurality of ranks correspond to different bits of the write data.

2. The memory module as claimed in claim 1, wherein, if the read data and the bit value of at least one bit of the write data replaced with the first parity data are the same, the rank through which the read data is transmitted is passed.

3. The memory module as claimed in claim 1, wherein, if the read data and the bit value of at least one bit of the write data replaced with the first parity data are inverted relative to each other, the rank through which the read data is transmitted is failed.

4. The memory module as claimed in claim 1, wherein the parallel test apparatus comprises:
at least one XOR gate configured to generate the first parity data for the write data during the write operation and generate the second parity data for the first data during the read operation; and
at least one multiplexer configured to replace the bit value of at least one bit of the plurality of bits of the write data with the first parity data.

5. The memory module as claimed in claim 1, wherein each of the plurality of ranks further comprises:
an interface unit connected to the parallel test apparatus to communicate with the parallel test apparatus, and configured to receive the write data during the write operation and transmit the read data during the read operation; and
a storage unit connected to the parallel test apparatus to communicate with the parallel test apparatus and configured store the first data.

6. The memory module as claimed in claim 5, wherein the interface unit includes input/output lines respectively corresponding to the plurality of bits of the write data and shared by the plurality of ranks.

7. The memory module as claimed in claim 6, wherein:
during the write operation, a receiver of all of the input/output lines is driven during the write operation, and
during the read operation, a driver of remaining input/output lines other than an input/output line through which the read data is transmitted is not driven.

8. The memory module as claimed in claim 1, wherein, during the write operation and the read operation in the parallel test mode, a data width of read data of each rank is less than a data width of write data of each rank.

9. The memory module as claimed in claim 1, wherein, when a total number of the plurality of bits of the write data is n times a number of the plurality of ranks, a number of at least one bit of the write data replaced with the first parity data and a number of at least one bit of the read data are each n.

10. The memory module as claimed in claim 1, further comprising a memory controller for generating a parallel test mode start signal,
wherein the parallel test control unit of each of the plurality of ranks generates the parallel test control signal in response to the parallel test mode start signal.

11. The memory module as claimed in claim 1, wherein a number of write data bits and a number of ranks to be tested in the parallel test mode are each n, wherein n is a natural number equal to or greater than 2.

12. The memory module as claimed in claim 11, wherein the parallel test apparatus is configured to generate, in response to the parallel test mode control signal, a first parity bit for the n write data bits and replace a bit value of at least one bit of the n write data bits with the first parity bit during a write operation, and generate a second parity bit for n first data bits including the first parity bit and n−1 remaining write data bits and transmit the second parity bit as one read data bit during a read operation.

13. The memory module as claimed in claim 11, wherein the parallel test apparatus comprises:
at least one XOR gate for generating the first parity bit for the n write data bits during the write operation, and generating the second parity bit for the n first data bits including the first parity bit and the n−1 remaining write data bits; and
at least one multiplexer for replacing the bit value of one bit of the n write data bits with the first parity bit.

14. A memory module, comprising:
a plurality of ranks each including a group of rank input/output terminals including a representative rank input/output terminal for transmitting read data; and
a package including a group of package input/output terminals electrically connected to the group of rank input/output terminals of each of the plurality of ranks,
wherein in a parallel test mode, each of the plurality of ranks receives write data of a full data width through the group of rank input/output terminals from the group of package input/output terminals, and transmits read data of a reduced data width through a corresponding package input/output terminal from the representative rank input/output terminal of each of the plurality of ranks, and
package input/output terminals corresponding to representative rank input/output terminals of the plurality of ranks are different from one another in units of the ranks, and read data from the plurality of ranks corresponds to different bits of the write data.

15. The memory module as claimed in claim 14, wherein each of the plurality of ranks comprises a parallel test apparatus configured to generate first parity data for write data including a plurality of bits and generate first data that is obtained by replacing a bit value of at least one bit of the plurality of bits of the write data with the first parity data during a write operation, and generate second parity data for the first data and transmitting the second parity data to the representative rank input/output terminal as the read data during a read operation,
wherein combinations of read data from the plurality of ranks correspond to different bits of the write data.

16. A parallel test method for a memory module including a plurality of ranks, each of the ranks including a parallel test apparatus and configured to perform the parallel test method, the parallel test method, comprising:
receiving write data including a plurality of bits;
generating first parity data corresponding to the write data;
generating, during a write operation, first data that is obtained by replacing a bit value of at least one bit of the plurality of bits of the write data with the first parity data;
generating, during a read operation, second parity data for the first data; and
transmitting the second parity data as read data.

* * * * *